United States Patent [19]

Ruf et al.

[11] 4,314,235
[45] Feb. 2, 1982

[54] SYSTEM FOR UTILIZING A CONVENTIONAL N-BIT SUCCESSIVE APPROXIMATION REGISTER TO GENERATE DATA WORDS WITH MORE THAN N PLACES

[75] Inventors: Wolfgang Ruf, Munich; Eduard Wagensonner, Aschheim, both of Fed. Rep. of Germany

[73] Assignee: AGFA-Gevaert Aktiengesellschaft, Leverkusen, Fed. Rep. of Germany

[21] Appl. No.: 116,801

[22] Filed: Jan. 30, 1980

[30] Foreign Application Priority Data

Jan. 31, 1979 [DE] Fed. Rep. of Germany ....... 2903728

[51] Int. Cl.³ .......................................... H03K 13/02
[52] U.S. Cl. ...................... 340/347 AD; 340/347 M; 354/23 D

[58] Field of Search ................... 340/347 M, 347 AD; 354/23 D, 60 L

[56] References Cited

PUBLICATIONS

The Engineering Staff of Analog Devices, Inc., Analog–Digital Conversion Handbook, 6/1972, pp. II-46 to II-48; II-80 to II-87.

*Primary Examiner*—Thomas J. Sloyan
*Attorney, Agent, or Firm*—Michael J. Striker

[57] ABSTRACT

An analog-to-digital converter is disclosed which utilizes a successive approximation register. The operation of the successive approximation register is so controlled that any analog signal within a dynamic range requiring more bits than the successive approximation register can hold can nonetheless be accurately converted within a predetermined tolerance.

3 Claims, 5 Drawing Figures

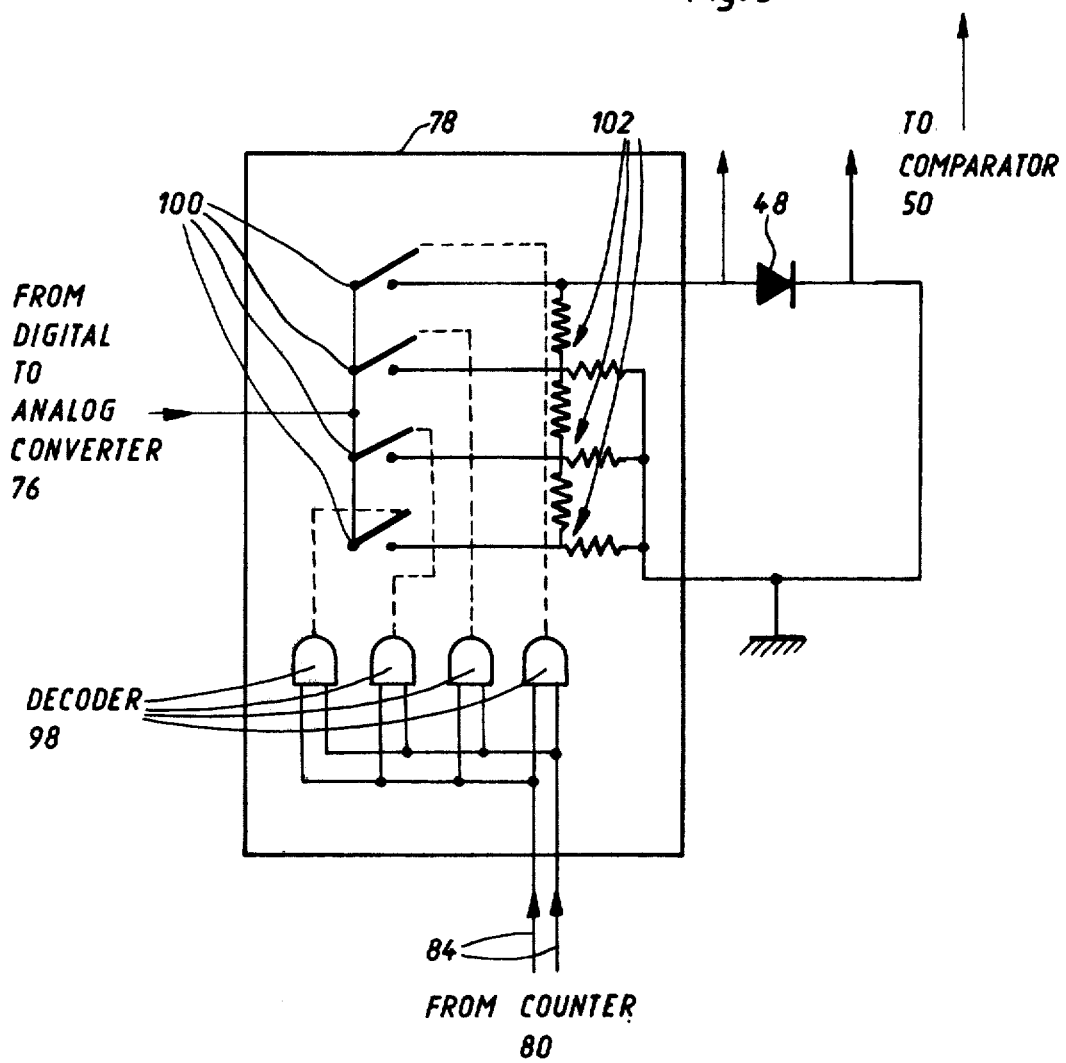

1

SYSTEM FOR UTILIZING A CONVENTIONAL N-BIT SUCCESSIVE APPROXIMATION REGISTER TO GENERATE DATA WORDS WITH MORE THAN N PLACES

BACKGROUND OF THE INVENTION

1. Field of the Invention

This invention pertains to analog-to-digital conversion techniques. More specifically, this invention pertains to such techniques which are designed to enable a successive approximation register to generate data words which accurately represent, within a predetermined tolerance, an analog signal that can vary within a dynamic range that encompasses more bits than the successive approximation register can handle at one time.

2. Description of Prior Art

A successive approximation register is a semiconductor device which is designed for use in an analog-to-digital conversion system in order to convert an analog electrical signal to a digital data word expressed in parallel form. In such a system, the dynamic range of the analog signal to be expected is known in advance. This analog signal is first compared with a reference signal in a comparator, which may be an operational amplifier or other suitable device. Initially, the reference signal chosen is chosen to equal one-half of the maximum value which the analog electrical signal can be expected to reach. In the event that the analog signal equals or exceeds the reference signal so chosen, the comparator produces a logically high output. In the event that the analog signal is less than the reference signal so chosen, the comparator then produces a logically low output.

This comparison process is then repeated utilizing a reference signal that is chosen depending upon the results of the prior comparison. If the prior comparison indicates that the analog electrical signal is greater than a referenece signal equal to one-half the maximum value which the analog signal is expected to reach, the analog signal is then compared with a reference signal which is equal to three-fourths of the maximum value which the analog signal can be expected to reach. As before, the comparator will produce a logically high output when the analog signal exceeds this three-fourths value, and will produce a logically low signal otherwise. Conversely, in the event that the initial comparison indicated that the analog signal was less than one-half the maximum expected value, the analog signal would be compared with a reference signal equal to one-fourth of such maximum expected value, and a logically high or logically low output would be generated as before.

This comparison process is then repeated as many times as is necessary in order to achieve the desired accuracy of the analog-to-digital conversion. If only one such comparison is made, the resulting "1" (or logically high comparator output) or resulting "0" (logically low comparator output) will be only 50% accurate. A two-stage comparison process will be 25% accurate, and in general the accuracy of the conversion process will be equal to that percentage which corresponds to $\frac{1}{2}^n$, wherein n is equal to the number of comparisons performed in the conversion operation. Thus, an analog-to-digital conversion process which utilizes four such comparisons will have a tolerance of 1/16, or approximately 6%.

It will thus become evident that in order to retain the results of such comparisons, it is necessary to provide a semiconductor device which stores the 0's and 1's produced during the sequence of comparisons utilized in order to generate a digital data word which represents the value of the analog signal. For example, if a four-comparison process is used, the digital data word would be a binary four-placed number. If, for example, this number was 1111, then the analog signal would be equal to 15/16 of the maximum value which would ordinarily be expected.

Thus, successive approximation registers are now in existence which have a data input and a plurality of parallel data outputs, which parallel data outputs are arranged in a sequence going from a most significant bit or MSB, to a least significant bit or LSB. In, for example, a known successive approximation register, there may be eight parallel data outputs to enable the data resulting from an eight-step comparison process to be simultaneously registered and stored. Thus, a comparator would be connected to the data input of such a successive approximation register, and each time a comparison was performed a logically low or logically high signal would appear at a corresponding one of the parallel data outputs.

However, such successive approximation registers are not currently available with very large bit holding capacities. Thus, if such a successive approximation register is to be used in an analog-to-digital conversion system which is designed to convert an analog signal which may vary within a very wide dynamic range, inaccuracy will result. For example, modern photographic equipment such as still cameras and motion-picture cameras can distinguish between eighteen separate intensities of light, in which each intensity is double the intensity of the previous one. Broadly put, a modern camera can be utilized in a wide range of illumination intensities, ranging from the brilliant illumination of arc lights to perhaps the illumination provided by a burning match. With such a wide dynamic range encompassed by the illumination which can be expected, which dynamic range requires eighteen bits in order to express it, a successive approximation register which holds eight bits will not operate properly if used in a conventional fashion in the automatic exposure system of such a camera. For example, it would be prefectly possible for an illumination to be used which is sufficiently low so that all the parallel data outputs of the successive approximation register would read 0, while the light intensity available would still be sufficient to enable the camera to be used.

However, when a successive approximation register is to be used in such a camera, it is not necessary that the analog-to-digital conversion be extraordinarily accurate. Since a modern motion picture camera can accept a tolerance of one-tenth of a stop, which tolerance corresponds to approximately a 7% variation in light intensity, it is only necessary that the digital data word to be used in the camera exposure system, have an accuracy equal to or only slightly greater than 7%. A digital data word of only four bits would thus suffice in terms of exposure accuracy, as long as the weight to be accorded this four-bit digital data word were known.

In other words, although the illumination of a scene to be photographed has such a broad dynamic range that eighteen bits are required in order to accurately describe the entire dynamic range exactly, once the portion of that dynamic range which is actually being measured is known, it is not necessary to measure the exact value of the illumination to an accuracy of greater than 7%. Thus, as long as it is known in what portion of the dynamic range the camera is actually to be used, only four bits are actually required.

Because analog-to-digital converters utilizing successive approximation registers can be made to operate at a rapid rate and can be made to produce conversions with a high degree of accuracy, it would be desirable to provide a system which would allow a conventional successive approximation register to be used in a conversion system of this type.

SUMMARY OF THE INVENTION

This object is achieved, as are others which will become apparent hereinafter, in this invention. In this invention, a comparator is used in the normal fashion, with the analog electrical current (which in the preferred embodiment is the current passing through the photocell of a modern camera which has an automatic exposure system) being compared with a scalable reference signal that is provided by the system. Initially, this reference signal is so chosen that it represents the most insensitive range of measurement, i.e. that range of measurement which corresponds to the brightest possible illuminations which can be expected in use. While this reference signal is being used, a number of binary comparisons are performed in the manner described above. However, the number of comparisons which are actually performed is less than the bit-holding capacity of the successive approximation register. In the event that the comparator fails to produce a logically high output during the comparison process, the analog-to-digital conversion system disclosed herein "knows" that the illumination actually being used is substantially less than the maximum intensity which can be expected. Then, the reference signal is scaled so as to cause a more sensitive dynamic range to be examined. As the reference signal is being re-scaled, the successive approximation register is reset, and an internally-generated weighting signal is generated which indicates that this less-sensitive range is being examined.

The comparison process is then repeated, with the same number of comparisons being performed. Once again, the failure of the comparator to produce a logically high output signal indicates that the illumination actually utilized is still less intense and a further re-scaling and re-calibration and resetting of the successive approximation register occurs. This process continues until such time as the comparator produces at least one logically high output, which production indicates that the proper region of the dynamic range of the illumination actually used has been located. At this time, the successive approximation register can be used in the conventional fashion in order to convert the current from the photocell into a digital data word which has at least four bits in it.

In the preferred embodiment, the system is so designed that in the event at least one logically high output of the comparator is detected, unnecessary comparisons which would produce digital data words of excessive accuracy can sometimes be avoided. This enables the comparison process to be aborted in the event that sufficient analog-to-digital conversion accuracy is obtained. Moreover, the frequency with which the analog signal is sampled can be increased during the initial stages of the conversion process, so as to increase the speed with which conversion occurs.

Because the conversion system disclosed herein utilizes no capacitors, it is extremely fast and problems resulting from noise generation do not hinder operation. Moreover, conventionally-available successive approximation registers can be used in order to reduce manufacturing costs.

With the foregoing in mind, other objects and advantages will be explained and described in detail in the accompanying specification and shown in the drawings.

BRIEF DESCRIPTION OF THE DRAWINGS

FIG. 5 is a detail view of a portion of the schematic shown in FIG. 4.

DETAILED DESCRIPTION OF THE PREFERRED EMBODIMENTS

Figure 1:
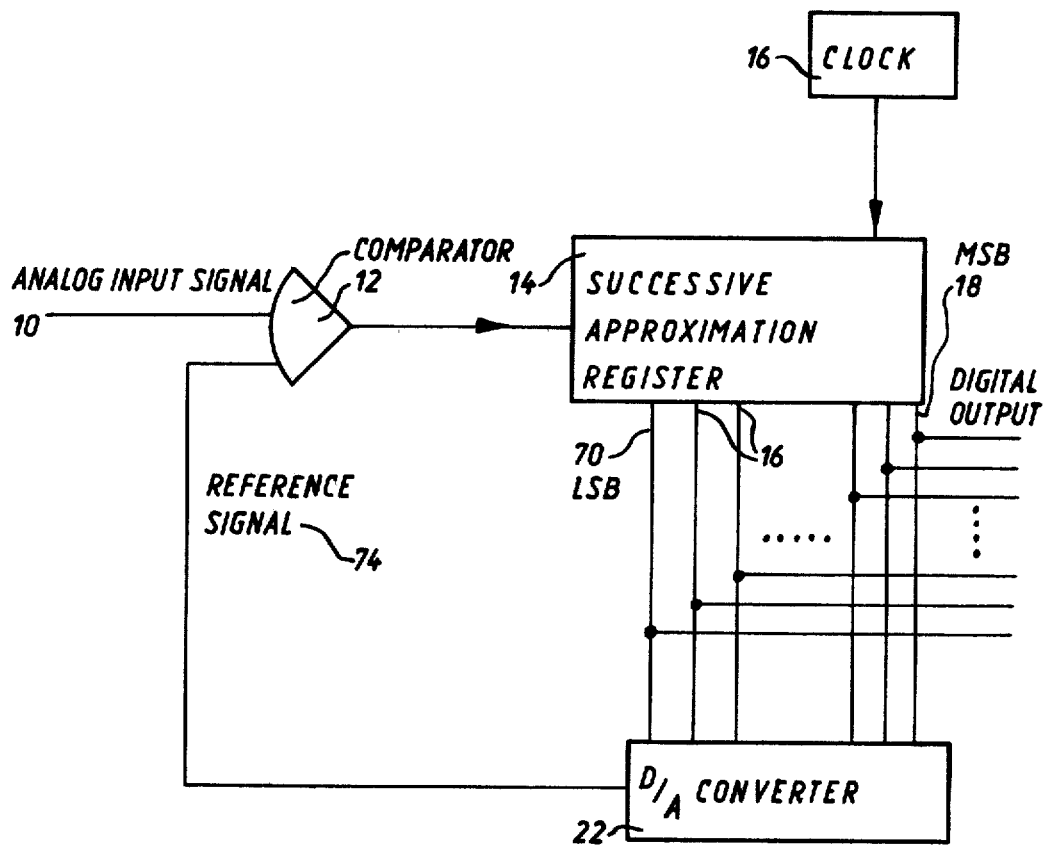
FIG. 1 is a block diagram illustrating a conventional analog-to-digital conversion system utilizing a successive approximation register.

Referring first to FIG. 1, it can be seen that an analog input signal 10 is to be converted into a digital signal in parallel form. To that end, a comparator 12 is provided, with the analog signal 10 being introduced to one input of the comparator 12. The output of the comparator 12 is connected to the data input of a successive approximation register 14 which is clocked by a clock 16. The successive approximation register 14 has a plurality of output terminals 16, of which the output 18 represents the most significant bit (MSB) and of which output 20 represents the least significant bit (LSB). All these output terminals are connected to a digital-to-analog converter 22, which produces a reference signal 24 that is routed to another input of the comparator 12.

In use, the analog input signal 10 is compared with the then-current reference signal 24 in the comparator 12. Each such comparison takes place every time that the clock 16 produces a clock pulse. Initially, the reference signal 24 is set to equal a value equal to one-half the maximum value which can be assumed by the analog input signal 10. In the event that the analog input signal 10 is equal to or greater than the initial value of the reference signal 24, output terminal 18 is made logically high, and in the event that the analog input signal 10 is lesser than the value of the reference signal 24, output terminal 18 is logically low. Upon the receipt by the successive approximation register 14 of the next clock pulse generated by clock 16, the analog input signal 10 is compared to a reference signal 24 which is either three-fourths or one-fourth the above-mentioned maximum value, depending upon the results of the first comparison described above. If, for example, the analog input signal 10 is greater than one-half of this maximum value, it will be next compared with a reference signal 24 which is scaled by the digital-to-analog converter 22 so as to next be compared with a reference signal 24 that is equal to three-fourths the above-mentioned maximum value. In the event that the analog input signal 10 is still greater than this increased reference signal 24, then the adjacent output terminal 16 will be brought logically high, and will be logically low otherwise. On the other hand, in the event that the analog input signal 10 was originally less than the initial reference signal 24, it will next be compared with a reference signal 24 which is adjusted to have a value equalling one-fourth of the above-mentioned maximum value, to produce a 37 1" or a 37 0" at the immediately adjacent output terminal 16, depending upon the results of this next comparison.

This process is then repeated as many times as there are outputs 16 of the successive approximation register 14, until output terminal 20 is either brought logically low or logically high depending upon the results of the comparison to which it corresponds. At this point, the logical statuses of all the outputs 16 (including of course outputs 18 and 20) can be described by a binary number in which a "1" represents a logically high state and in which a "0" represents a logically low state. For example, if all the outputs of the successive approximation register 14 have the logical values shown below, they will correspond to analog input signals 10 having that fraction of the maximum expected value of the analog input signal 10:

| Digital Data Word | Fraction of Full Scale |
|---|---|
| 00000000 | 0 |
| 00000001 | 1/256 |
| 00000010 | 1/128 |
| 00000011 | 1/128 + 1/256 = 3/256 |
| 00000100 | 1/64 |
| . | |
| . | |
| . | |
| 01000000 | ¼ |
| . | |
| 01100000 | ¼ + ⅛ = ⅜ |
| . | |
| . | |
| 10000000 | ½ |
| . | |
| . | |
| 11000000 | ½ + ¼ = ¾ |
| . | |
| 11111111 | 255/256 |

It may thus be seen that using an analog-to-digital conversion system of this sort, a data output in parallel form can generate a digital data word with as many places as there are output terminals of the successive approximation register 14. Systems of this sort are already known, and therefore this system will not be further described.

Figure 2:
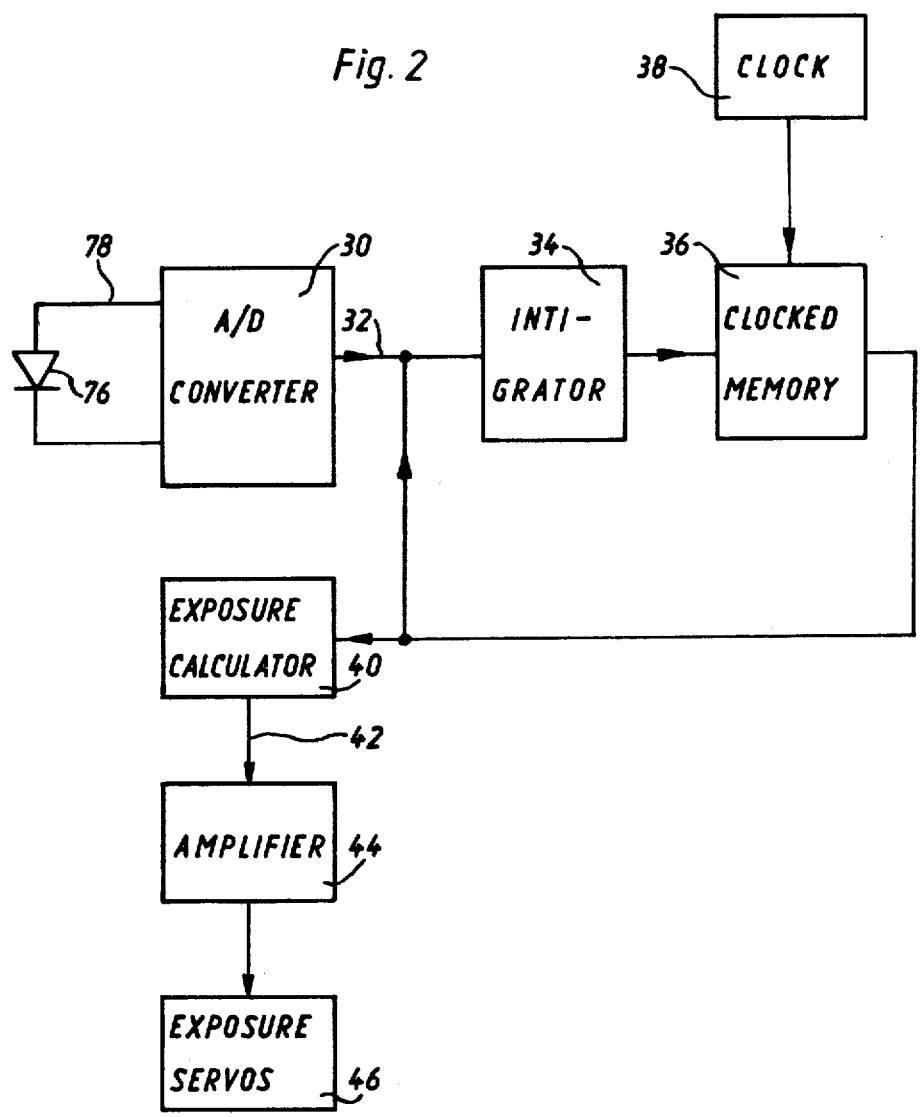
FIG. 2 is a block diagram showing how the invention herein can be used in the automatic exposure system of a camera.

In FIG. 2, a photocell 26 or other suitable light-responsive semiconductor device (such as a phototransistor, photodiode and the like) is located inside a modern photographic camera (not shown) so as to measure the intensity of the ambient light in which the camera is being utilized. For the purposes of this discussion, the photocell 26 may view the scene to be photographed either through the lens (not shown) of the camera or not. It is only important for the purposes of this discussion to know that the output of photocell 26 will have some correspondence to the intensity of the ambient light in which the camera is to be used.

Photocell 26 is a photocell or other suitable semiconductor device (such as a phototransistor, photodiode or other suitable semiconductor element) which delivers an analog input signal 28 into an analog-to-digital converter 30 such as is disclosed herein. This converter 30 converts the analog input signal 28 to a digital output signal 32, which is routed to an integrator 34 which operates to provide a time-integral of the intensity of the analog input signal 28 by means of repeated additions. These repeated additions take place as the progressively increasing sum is clocked into and out of clocked memory 36 by a clock 38. Once an accurate time-integral has been produced by this series of repeated additions, the information is routed to an exposure calculated 40 into which information such as film speed can be introduced in order to allow parameters such as lens setting and shutter speed to be adjusted. Exposure calculator 40 produces a control signal 42 which, after amplification in amplifier 44, can be used to drive suitable exposure servos 46 such as the shutter and the elements which control the opening of the lens utilized on the camera.

Methods which produce time-integrals of signals such as analog input signal 28 are already known. It will be understood by one skilled in the art that the heart of such a system that has just been disclosed resides in the analog-to-digital converter 30.

In order to understand how this invention operates, it is helpful to visualize an eighteen place binary number which can represent the entire dynamic range in which incident light as received by the photocell 26 is represented. Such a number takes the form of:

XXXXXXXXXXXXXXXXXX in which the X to the far left represents one-half the full-scale light intensity to be expected, the next X to the right represents one-fourth of this full scale number, and the remaining places represent smaller and smaller fractions of this full-scale value in which the denominators increase as successive powers of 2.

Modern cameras can operate over such a dynamic range, but differences in light intensity of less than 7% cannot be detected by such a camera, since such differences correspond to less than 1/10 of a photographic stop. A four place binary number is accurate to 1/16, or slightly more than 6%, which is below this 7% figure. Thus, in the even that 9 four bit group containing 1's is detected in such an eighteen place binary number, the number represented by these four bits will be sufficiently accurate in order to allow the exposure of such a camera to be accurately set. As an example, if the number representing the ambient light intensity in which the camera is utilized is

1111XXXXXXXXXXXXXX, it is unnecessary to consider anything after the four 1's since the rest of the components of this eighteen place binary number will not amount to a difference of more than 7%. Thus, once such a digital data word is detected, only the first four figures are significant, and the rest can safely be ignored since the other digits will not result in increased exposure accuracy.

However, in the event that this digital data word is 0000 0000 01111XXXXX those skilled in the art will readily understand that the 0's to the left of the 1's must be considered while the remaining digits are, as before, irrelevant. Without considering the left-hand string of 0's in this latter number, the significance of the number thus represented cannot be ascertained.

Hence, it is possible to divide such a number into groups, and to look at the groups thus formed to see if they contain any 1's. Supposing, for example, that this latter number were divided into groups of five, and each group scanned for the existence of a 1, a scanner of this latter number would first see a group which was composed of all 0's. Thus, this would mean that whatever digits were to the right of the first group scanned, the number represented could not exceed 1/32 of the full-scale value of the maximum expected light intensity. In the event that the next five digits were all 0, it would follow that, regardless of the number of digits after the tenth digit in the series, the entire number would have to be less than 1/1024 of full scale.

Hence, by dividing this eighteen digit data word into groups and looking for the first one in any group, it would be possible to assign a weight to the first "1" found by keeping track of the groups that had been examined.

In this second example given, a "1" would be detected within the second group of five digits, or bits, which was scanned. However, it will be immediately apparent to one skilled in the art that in order to achieve the desired level of accuracy, the mere detection of this first "1" in the tenth place will not suffice.

A productive way in which a string of bits such as the ones illustrated above can be examined to achieve the necessary accuracy is to divide the string of bits into groups of five, to check for the existence of at least one "1". In the event that within any group of five bits, there is at least one "1", only this group of five bits and the following (three) bits of the register will be considered or read. The register runs to its last bit. The A/D conversion is then stopped.

However, in the event that there is at least one "1" in this group of five bits, the possibility exists that the only such "1" in existence is the "1" in the fifth bit in the group. In this case, more information is necessary since, as in the case listed above, the first four bits in any five bit group must be known and thus the ninth and tenth bit in the second data word shown above does not provide sufficient information. Hence, when the third, fourth or fifth bit in any five bit group is a "1", more information is needed.

Figure 3:
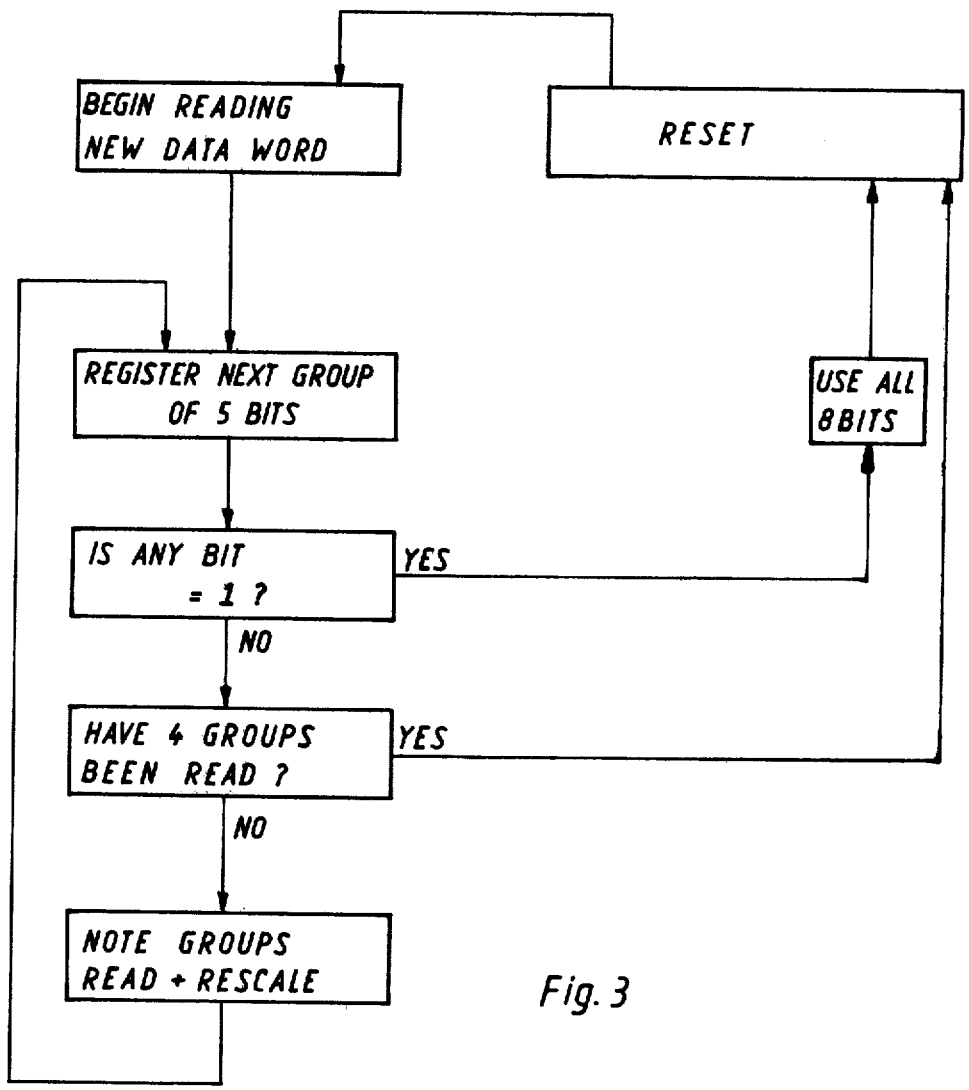
FIG. 3 shows a flow chart indicating the operation of the invention.

FIG. 3 is a flow chart showing a method that can be used in order to examine data words and to stop such examination when an accuracy of better than 7% has been achieved. First, a group of five bits is examined. The group is then examined as a whole, to see if any of the bits in the group are 1's so as to determine whether or not the analog signal under examination falls within 1/16 of full scale. In the event that no such "1" is detected, it is known that not only is there a sufficiently small analog quantity so that the analog signal is below 1/16 of full scale, but is also less than 1/32 of full scale.

In the event that no such 1's are detected, then it is known that the analog signal corresponds to a portion of the dynamic range which is less intense that the portion under examination. In this case, the previous examination of five bits is noted and a subsequent group of five bits then examined. This process of examination can occur until such time as at least one "1" is detected.

Assuming that a "1" is so detected in any five-bit group, i.e. the third or fourth bit of this group, the register does not stop at the fifth bit. It runs to the last of the following bits of the register, which register then will be stopped. In the event that the third bit is "1" the digital word consists of the third bit up to the eighth bit of the register. That means the accuracy of the digital word is six bits. In case that the fifth bit is "1" the digital word consists of the fifth bit up to the eighth bit of the register. That means the accuracy equals four bits which is the lowest possible accuracy for a data word. These digital words form a data word in parallel form, which can be used for subsequent computational purposes.

Finally, the possibility exists that the analog-to-digital conversion to be performed is taking place at the lowest end of the dynamic range with no illumination at all. In this case, which corresponds to the fourth group of five bits (because, of course, there are only eighteen bits required in order to express the entire usable dynamic range), the absence of 1's is noted and the next digital data word can be read.

The flow chart shown in FIG. 3 has been discussed as if the eighteen bit digital data word already existed in toto prior to this reading process. In fact, this eighteen bit digital data word is actually constructed in a sequential fashion, depending upon the results of comparisons formed by a comparator such as is always used in an analog-to-digital conversion system which uses a successive approximation register. In fact, as can be seen from the schematic diagram shown in FIG. 4, to which reference may now be had, the data word constructed in the analog-to-digital conversion may have as few a eight bits or may have as many as twenty-three bits, depending upon the magnitude of the analog signal to be converted.

Figure 4:
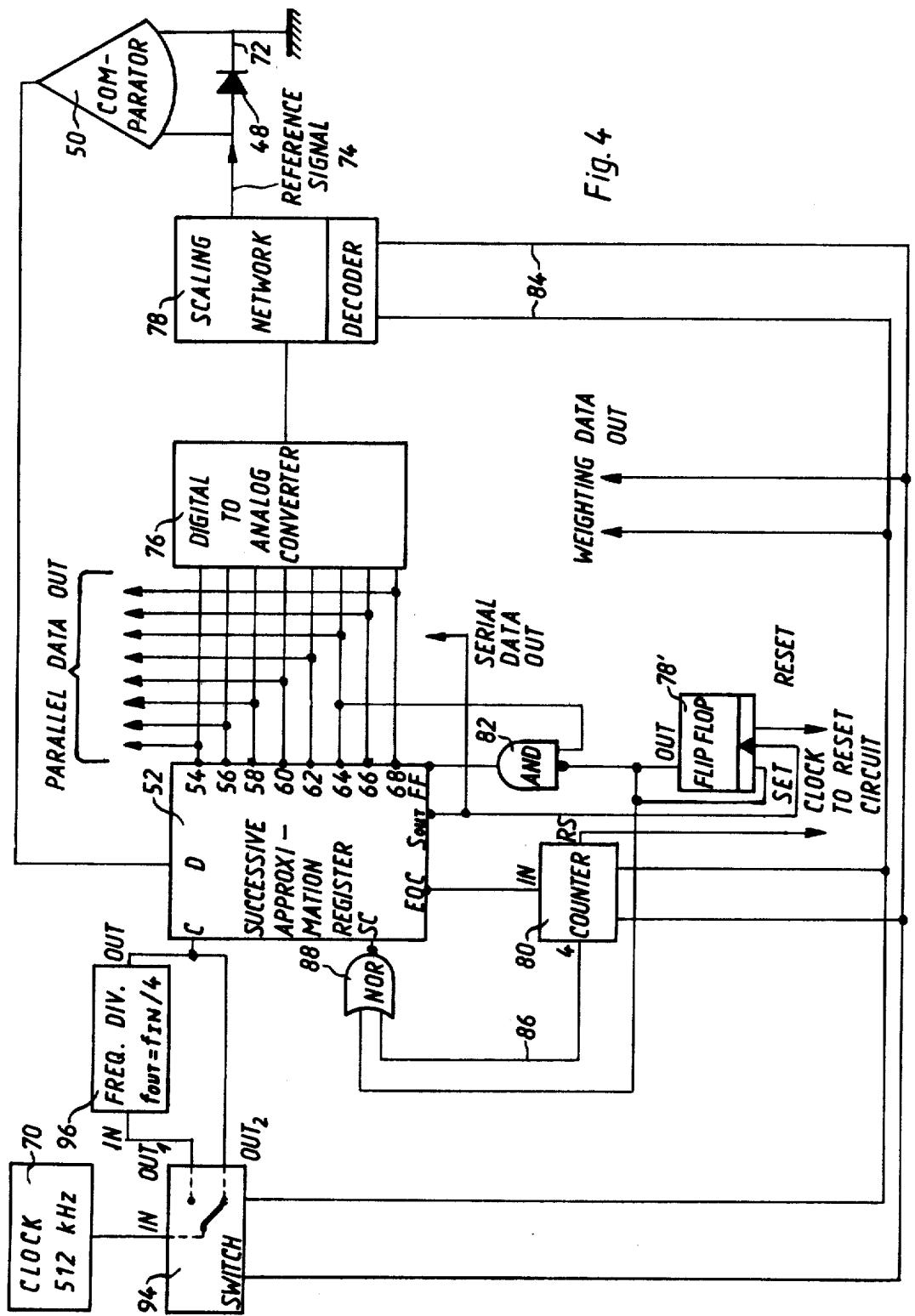
FIG. 4 is a schematic diagram of the invention.

In FIG. 4, a photocell 48 (or other suitable semiconductor device such as a phototransistor, a photodiode, or other suitable element) is connected across the input terminal of comparator 50. The output of comparator 50 is routed to the digital input of a successive approximation register 52. A suitable successive approximation register for this application is manufactured by Motorola Semiconductor Products, Inc., under number MC14559. The successive approximation register 52 has eight parallel data outputs 54, 56, 58, 60, 62, 64, 66 and 68. Parallel data output 54 is that output which corresponds to the most significant bit (MSB), while parallel data output 68 corresponds to the least significant bit (LSB). Every time that a clock pulse generated by clock 70 is received at the clock terminal C of the successive approximation register 52, the analog signal 72 which passes through the photocell 48 is compared with a reference signal 74. In the event that analog signal 72 is equal to or greater than reference signal 74, comparator 50 produces a logically high output which is reflected at data input D of the successive approximation register 52. This comparison can occur because digital-to-analog converter 76 is connected to all of the parallel data outputs 54–68, and generates an appropriate electrical current which, after scaling in scaling network 78, can be converted into an appropriate reference signal 74. It will be noted that, except for the scaling network 78 just described, the other elements are connected together in an entirely conventional fashion.

The successive approximation register 52 is of a type which can be so connected that unwanted and unnecessary parallel data outputs may remain unused. For this purpose, feed forward terminal FF is provided on the successive approximation register 52. In the event that it is desired to read only the first five parallel data outputs 54-62, the feed forward terminal FF can be connected directly to parallel data output 64. In other words, when the successive approximation register 52 is to be used to produce an output of n bits, where n is less than eight, the (n+1)th parallel data output will be connected to feed forward terminal FF. However, in the event that all eight parallel data outputs 54-68 are to be utilized, feed forward terminal FF is simply brought logically low.

Successive approximation register 52 also has a serial output terminal $S_{out}$. Whenever any of the parallel data outputs 54-68 is brought logically high during the operation of the successive approximation register 52, $S_{out}$ will also be brought momentarily high, with the next clock pulse, so that the data emerging from the successive approximation register 52 in parallel form on parallel data outputs 54-68 will also be reflected at terminal $S_{out}$ in serial form. Start convert terminal SC of the successive approximation register 52 is pulsed when it is desired to cause the successive approximation register 52 to begin to execute a conversion sequence. Finally, the end of convert terminal EOC of successive approximation register 52 will go logically high upon the registration of a logically low or logically high state at the parallel data output to which feed forward terminal FF is connected.

When a conversion sequence is to be performed, flip-flop 78' and counter 80 are initially reset so that flip-flop 78' has a logically low output and counter 80 begins to count at "0". Output 4 of counter 80 is logically low. All parallel data outputs 54 to 68 will be logically low. The NOR-gate 88 subsequently brings the input SC of successive approximation register 52 on logically high. When a clock pulse generated by the clock 70 is received at clock terminal C of the successive approximation register 52 its output 54 becomes logically high and the analog signal 72 is compared with a reference signal 74 which at that moment corresponds to one-half of full scale. In the event that the analog signal 72 is less than the reference signal 74, the comparator 50 will produce a logically low output at data input terminal D of the successive approximation register 52 and parallel data output 54 will be reset to logically low with the following clock pulse. Simultaneously the output 56 of the register 52 will be brought logically high so as to produce a reference signal 74 which corresponds to one-fourth of full scale. The reference signal 74 is once again compared with the analog signal 72. In the event that the analog signal 72 is still less than the reference signal 74, the comparator 50 once again produces a logically low output and parallel data output 56 is reset to logically low. Assuming for the moment that the analog signal 72 is sufficiently low so that the first four comparisons (which are performed in an entirely conventional manner) result in the generation of four successive 0's, the first four parallel data outputs 54-60 will be brought logically low. Upon the performance of a fifth comparison by comparator 50, parallel data output 62 will be brought logically low.

Parallel data output 64 is connected to one of the inputs of AND-gate 82. The output of AND-gate 82 is connected to the feed forward terminal FF of the successive approximation register 52. As was mentioned above, this connection causes the successive approximation register 52 to recycle back to parallel data output 54 upon the next conversion performed, regardless of the logical status of parallel data output 64. The reason for such recycling is, of course, that feed forward terminal FF is connected to parallel data output 64 through AND-gate 82 and that the second (inverted) input of the AND-gate 82 is on logically low.

When the parallel data output 64 is brought logically low or logically high, end of convert terminal EOC is momentarily brought logically high. This causes counter 80 to count up to 1. Since the contents of counter 80 are transmitted to scaling network 78 via lines 84, the scaling network 78 can cause an appropriate reference signal 74 to be scaled so that it has the same value it would have had in a normal analog-to-digital conversion process wherein the successive approximation register 52 would bring parallel data output 64 logically low or logically high in conventional fashion.

Thus, five comparisons have been performed by comparator 50, and since the results of each such comparison resulted in the generation of a "0", the 0's appear on parallel data outputs 54-62 and the output of counter 80 registered on line 84 can be used to assign a weight to these 0's, so that subsequent apparatus can utilize the data appearing at the parallel data outputs 54-62 in connection with an appropriate weighting factor.

Assuming that the next five comparisons performed by the comparator 50 results in the generation of five 0's, these 0's will be reflected, as before, on parallel data outputs 54-62, a momentary pulse will appear at end of convert terminal EOC, and the counter 80 will count to 2. An appropriate weighting factor thus appears on lines 84, the scaling network 78 is scaled, an appropriate reference signal 74 is generated, and five subsequent comparisons are performed. After the twentieth comparison performed by comparator 50, the end of convert terminal EOC will be momentarily pulsed once more, and the counter 80 will count to 3.

At this point, it is known that the entire dynamic range of analog signal 72 has been exhausted, and no further comparisons are necessary. In physical terms, this condition corresponds to a situation in which a modern motion picture camera is being utilized in insufficiently bright illumination. Because counter 80 has counted to 3, line 86 is brought logically high. Line 86 is connected to one of the inputs of NOR-gate 88, and the output of NOR-gate 88 is connected to start convert terminal SC. Thus, start convert terminal SC at that time is brought logically low to cause the successive approximation register 52 to run to the last of the three bits of the register 52. The A/D conversion is stopped until a further reset-pulse will start a new A-D conversion. This reset pulse will be produced by an appropriate reset circuit (not shown).

However, assume that there is sufficient light available for the camera to be used. In this case, one of the comparisons performed by comparator 50 will produce a logically high output at the output of comparator 50. This logically high output will be reflected at the data input terminal D of the successive approximation register 52, and a logically high condition will be registered at one of the parallel data outputs 54-62. At this point, a pulse appears at the serial output terminal $S_{out}$ and the output of flip-flop 78 will be brought logically high. Because the output of flip-flop 78 is connected to the second (inverse) input of the AND-gate 82, the feed forward terminal FF will be brought logically low. In this situation, the connection between parallel data output 64 and the feed forward terminal FF is severed, so that the successive approximation register 52 can continue to register the results of the next comparison on parallel data output 66. It will be noted that this will be the case regardless of which of the parallel data outputs 54-62 is brought logically high as a result of a logically high output of comparator 50. For example, if the first comparison performed by comparator 50 results in a logically high state of parallel data output 54, the flip-flop 78 will have a logically high output, feed forward terminal FF will be locked, and the comparison process will continue to the last (eighth) bit of the successive approximation register 52. As the output of flip-flop 78 is connected with one of the inputs of NOR-gate 88 the transition of the output of flip-flop 78 from logically low to logically high brings the input SC of the successive approximation register 52 logically low. As a result no further A/D conversion will start after the eighth bit of the A/D conversion just on run has been reached or read. The successive approximation register 52 remains stopped until a further reset pulse will come from the appropriate reset circuit (not shown). For example, if the first comparison performed by comparator 50 results in a logically high state of parallel data output 54, the data word will appear with sufficient accuracy of eight bit on parallel data outputs. If the fifth comparison performed by comparator 50 results in a logically high state of parallel data output 62, the data word will appear with a sufficient accuracy of four bits. The high state of parallel data output 62 is the ultimate possible high state of the conversion just on run to have a sufficient accuracy of at least 4 bits. The data weight of these eight or four bits will appear on parallel data outputs 54 to 60. The digital data word on parallel data outputs 54 to 60 will be transmitted to an integration circuit (not shown).

This integration circuit produces a reset pulse which is transmitted to flip-flop 78 and to counter 80. A new A/D conversion begins as described above. The integration circuit is operated or influenced by the parallel data outputs 54 to 68 and by the lines 84, which characterize the data weight (weighting data out).

Alternatively the integration circuit may be operated or influenced by output $S_{out}$ i.e. serial data output of successive approximation register 52 (serial data out). In this case only data output $S_{out}$ is connected to the integration circuit. The number of clock pulses on the input C of the successive approximation register 52 characterizes the data weight of the serial data pulses. The data weight of serial data pulses is characterized by the time sequence of the data pulse on output $S_{out}$ of the successive approximation register 52 beginning with the start of A/D conversion.

Those skilled in the art will readily appreciate that as the magnitude of the reference signal 74 and the analog signal 72 decreases, longer and longer comparison times are necessary in order to allow the comparator 50 to discriminate between the values of reference signal 74 and analog signal 72 and to produce an appropriate output signal. Thus, it is desirable to slow down the comparison rate after the first five comparisons performed by comparator 50 indicate that no 1's exist. To that end, a switch 94 and a frequency divider 96 are interposed between the clock 70 and the clock terminal C of the successive approximation register 52. The switch 94 is connected to the output of counter 80, and can deliver the clock pulses generated by clock 70 either directly to clock terminal C or indirectly to this terminal, via frequency divider 96. After the first series of five comparisons are made and no 1's have been detected, the switch can route the clock pulse generated by clock 70 through the frequency divider 96 so as to effectively make the successive approximation register 52 receive clock pulses at a lower rate. This will slow down the sampling rate applied to analog signal 72, giving the comparator 50 a greater time in which to compare the reference signal 74 and the analog signal 72. As can be seen in FIG. 5, a decoder 98 composed of four AND-gates is connected to lines 84, so as to decode the output of the counter 80. Each of the AND-gates can, using suitable switching circuitry known to those skilled in the art, close one of the corresponding switches 100 that are all connected together at one side to the output of the digital-to-analog converter 76. The switches 100 feed into a resistor network 102 that is connected across the photocell 48. It will be obvious to those skilled in the art that by suitably closing one of these switches, the output of digital-to-analog converter 76 can be scaled by the resistor network 102 so as to progressively decrease the voltage that appears at the anode of photocell 48. Thus, the scaling network 78 can scale the output signal from the digital-to-analog converter 76 in accordance with the count to which counter 80 has counted.

When the clock 70 operates at a frequency of 512 kHz and the frequency divider 96 divides by a factor of 4, it will require approximately 200 microseconds for the successive approximation register as well to register the first five comparisons made by comparator 50 as to accomplish the integration in the integration circuit (not shown). Thus, for intense levels of light, the system disclosed herein can accomplish its desired task very quickly. At lower-intensity light levels, approximately 1 millisecond may be required in order to accurately accomplish the conversion. The speed of this system results in the main from the absence of capacitors in the system.

After each conversion has been accomplished, the data appearing at the parallel data outputs and the logical status of lines 84 can be used in subsequent time integration apparatus (not shown) such as was mentioned above. Alternatively, the serial data appearing at the serial data output can be used in order to accomplish the same result.

Thus, it can be seen that by utilizing the system disclosed herein, the successive approximation register 52 is caused to operate in a first mode (parallel digital words) and in a second mode (serial digital words). When the successive approximation register 52 operates in the first mode, the usable data required for subsequent time integration will appear on parallel data outputs 54-60. However, when the successive approximation register 52 operates in the second mode, the usable data will appear at serial data output $S_{out}$ of the successive approximation register 52. In both cases the accuracy of the digital data words is at least four bits and at most eight bits. Although a successive approximation register having only eight bits is utilized the total dynamic range of the successive approximation register 52 is 23 bits. Thus, there is ample capacity to completely cover a dynamic range of as many as twenty-three bits, even though the successive approximation register can hold only eight simultaneously. In this fashion, all the objectives of the invention are achieved.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A system for using a conventional clocked N bit successive approximation register to continuously sample an analog electrical signal at discrete intervals and to convert the sampled analog electrical signal to a corresponding digital data word which differs from the analog electrical signal by at least a predetermined tolerance, when the analog electrical signal spans a dynamic range emcompassing R bits, when R is an integer greater than N, comprising:

an N bit successive approximation register having a data input and N parallel data outputs, of which parallel data outputs one is a most significant bit parallel data output, of which parallel data outputs another is a least significant bit parallel data output, and of which parallel data outputs still another is an intermediate significant bit parallel data output;

an analog comparator connected to the analog electrical signal and the data input of the N bit successive approximation register, the analog comparator operating in a manner that when the analog electrical signal is at least equal to a scaled reference signal, a logically high signal will appear at the data input of the successive approximation register, and a logically low signal will appear at said data input otherwise;

a digital-to-analog converter connected to all of the parallel data outputs and producing a reference signal representing data appearing at the parallel data outputs;

a scaling network responsive to a scaling signal and connected to the digital-to-analog converter and the analog comparator and operating in a manner that the reference signal is scaled in response to the scaling signal and the scaled reference signal appears at the digital converter, whereby an operating range is selected in which at least one logically high signal is present at the data input of the successive approximation register;

a clock clocking the successive approximation register at discrete regular intervals; and a computational supervisor cooperating with the scaling network and the successive approximation register and operating in a manner that the successive approximation register operates in a first mode in which the successive approximation register registers a group of M successive bits from the most significant bit to the intermediate significant bit wherein M is an integer less than N, and further operates in a second mode in which the successive approximation registers the successive bits N-M from the intermediate significant bit to the least significant bit, whereby the computational supervisor generates such appropriate scaling signals as to cause the successive approximation register to operate in the first and in the second mode for an integral number of cycles at most equal to C, which number C is so chosen that $(C \times M + N - M)$ will be equal to R, and repeatedly operates in the first mode until at least one of the parallel data outputs between the most significant bit and the intermediate significant bit is logically high, and subsequent to such first mode operation operates in said second mode between the intermediate significant bit to the least significant bit, such generation of appropriate scaling signals being so chosen that when all outputs appearing at the parallel data outputs are placed in that sequence in which they have been registered, and in which sequence a first bit registered is a first element in the sequence, a digital data word will be formed which corresponds to the analog electrical signal within a predetermined tolerance with an accuracy of at least N-M bits.

2. The system defined in claim 1, wherein the computational supervisor operates in a manner that the accuracy of the digital data words of the successive approximation register is at least N-M and at most N, so that said digital data word corresponds to the analog electrical signal within the predetermined tolerance.

3. The system defined by claims 1 or 2, wherein the system further includes a variable sampling control cooperating with the computational supervisor, the successive approximation register and the clock in a manner that the intervals of time decrease after the successive approximation register has operated once in the first mode, where by the decrease of said time intervals is controlled by a counter which is connected to the successive approximation register.

* * * * *